United States Patent [19]
Luers

[11] 4,302,235
[45] Nov. 24, 1981

[54] PRODUCING A MULTI-COLOR IMAGE IN POLYCHROMATIC GLASS

[75] Inventor: George A. Luers, Horseheads, N.Y.

[73] Assignee: Corning Glass Works, Corning, N.Y.

[21] Appl. No.: 128,844

[22] Filed: Mar. 10, 1980

[51] Int. Cl.³ .................... C03B 25/00; C03B 32/00; C03C 3/22; C03C 3/26

[52] U.S. Cl. ........................ 65/30.11; 65/33; 65/60.8; 156/100; 430/5; 430/7; 430/494

[58] Field of Search ............ 65/33, DIG. 2, 32, 60 R, 65/30.11; 430/5, 7, 351, 494; 156/100

[56] References Cited
U.S. PATENT DOCUMENTS 4,057,408 11/1977 Pierson et al. .................. 65/33 X
4,092,139 5/1978 Ference ........................... 65/33 X
4,134,747 1/1979 Pierson et al. .................. 65/33 X

*Primary Examiner*—Richard V. Fisher
*Attorney, Agent, or Firm*—Clinton S. Janes, Jr.

[57] ABSTRACT

There is disclosed a method of producing an image of an original multi-color subject in polychromatic glass by employing, as a mask during initial exposure of the glass, a continuous tone, ultra-violet transmitting, film negative in which each color in the original subject is recorded in terms of a unique film density corresponding to that color in the glass and capable of conditioning the glass for development of such color by transmission of a single predetermined exposure flux. Methods of preparing the mask are also disclosed.

21 Claims, 4 Drawing Figures

PRODUCING A MULTI-COLOR IMAGE IN POLYCHROMATIC GLASS

RELATED APPLICATION

My companion application Ser. No. 128,831, also entitled "Producing a Multi-Color Image in a Polychromatic Glass", and filed of even date herewith, provides a method of producing an original multi-color subject in polychromatic glass by employing as a masking means, during initial exposure of the glass, high contrast film positives embodying the subject in the form of half tone transparencies.

BACKGROUND OF THE INVENTION

This invention is concerned with a form of photosensitively colored glass known as polychromatic glass. It is particularly concerned with a new and improved method of selectively developing a multi-colored image in such a glass.

Polychromatic glasses are capable of having a range of colors developed therein by certain combinations of radiation exposure and thermal treatment. Colors in such glasses result from a unique combination of alkali fluoride.silver halide microcrystals and metallic silver particles. It is not certain whether the silver is coated on, or contained in, the microcrystals, or whether it exists separately therefrom in minute discrete particles. Variation in color results from variation in exposure flux which is defined as the product of radiation intensity and exposure time.

The physical and chemical characteristics of polychromatic glasses, as well as general methods of development of a range of colors therein, are disclosed in detail in U.S. Pat. No. 4,017,318, granted Apr. 12, 1977 to J. E. Pierson and S. D. Stookey. U.S. Pat. No. 4,057,408, granted Nov. 8, 1977 to the same inventors, contains essentially the same disclosure and claims method aspects of the invention. The entire teaching of these patents is incorporated herein by reference to avoid repetition.

The patents generally disclose that polychromatic glasses may have widely-varying compositions, but must contain silver, alkali oxide, fluoride, at least one halide selected from the group of chloride, bromide and iodide, and, if ultra-violet radiation is employed, cerium oxide in minute amount. They further describe a general method of color production comprising four distinct steps:

(1) exposure to actinic or high energy radiation,
(2) heat treatment at a temperature between the glass transformation range and softening point,
(3) re-exposure of the glass to actinic or high energy radiation, and
(4) reheating to a temperature within or above the transformation range, but below the glass softening point.

In accordance with the patent teachings, a range of colors may be developed in a glass of suitable composition by first exposing the glass to actinic (ultra-violet) radiation in the range of 2800–3500A, or to high energy radiation such as X-rays or high velocity electrons. The amount of exposure flux from this exposure determines the depth and ultimate hue of the color to be produced in the glass, although only a latent image is developed in the glass during this initial exposure.

The glass is then subjected to a heat treatment at a temperature ranging from about the transformation range of the glass up to approximately its softening point. The glass composition selected, as well as temperature and time of the heat treatment, determine whether the final product will be transparent or opacified. The heat treatment causes colloidal silver particles to precipitate and serve as nuclei for the growth of alkali fluoride.silver halide microcrystals.

The nucleated glass is then again subjected to high energy or actinic radiation. The intensity and time of this second exposure depends on the desired intensity or saturation of the hue which was predetermined by the first exposure.

Finally, the glass is heated to a temperature within, or somewhat above, the transformation range, but below the glass softening point. It is believed that submicroscopic particles of metallic silver precipitate on the alkali fluoride.silver halide crystals during this heat treatment, thereby giving rise to color in the glass. The transformation range of a glass is commonly considered to lie in the vicinity of the glass annealing point.

U.S. Pat. No. 4,092,139, granted May 30, 1978 to J. Ference, discloses an alternate color developing procedure whereby the second exposure (the re-exposure) of the Pierson-Stookey method is carried out at a temperature between 200° and 410° C. to cause the metallic silver to precipitate, thus obviating the separate reheating step. Also, U.S. Pat. No. 4,134,747, granted Jan. 16, 1979 to Pierson and Stookey, describes a procedure wherein the potentially polychromatic glass is melted in a reducing atmosphere. During the color development procedure, this modification produces a so-called reverse opal effect, whereby exposed portions of the glass remain transparent, although colored, and unexposed portions of the glass become opacified.

PURPOSES OF THE INVENTION

In processing polychromatic glass, variation in exposure flux, and hence in color or hue, has customarily been achieved by varying the exposure time in the first exposure step while maintaining intensity constant. This has required selective masking of the glass, and has proven impractical, except for simple, straight line geometric designs.

It is a primary purpose of this invention to provide a novel method for faithfully reproducing a multi-color pattern, design, or other subject in polychromatic glass. A further purpose is to accomplish this with standard photographic and graphic arts materials. Another purpose is to provide a method wherein glass exposure time is held constant and a range of colors is produced by variations in exposure intensity. A particular purpose is to provide a practical means of utilizing polychromatic glass as an art medium whereby intricate, multi-color patterns or designs may be reproduced therein. A further particular purpose is to produce a multi-color image in a polychromatic glass using a continuous tone photographic film negative as a photomask or filter medium.

PRIOR ART

Reference is made to the several patents mentioned above in discussing the invention background. In particular, attention is directed to Examples 52–55 of the Pierson-Stookey patents which disclose use of continuous tone photographic film negatives in the exposure step of polychromatic glass processing.

Patents and literature relative to photosensitive materials, cited in the specifications of, or during prosecution of, these patents, may also be relevant. In addition, reference is made to textual publications describing current photographic film processing materials and techniques, in particular continuous tone film processing. For example, reference may be made to "Basic Photography for the Graphic Arts", (1972) published by Eastman Kodak, and "Basic Color for the Graphic Arts" (1964), also published by Eastman Kodak.

SUMMARY OF THE INVENTION

Figure 1A:
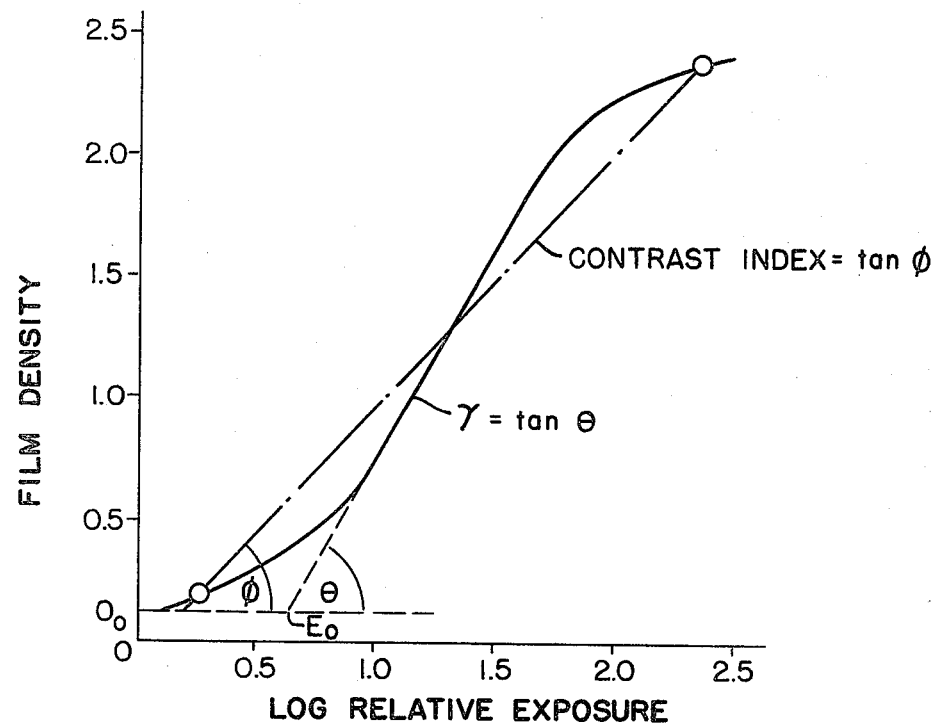
FIG. 1(a) is a graphical illustration of the characteristic curve for a photographic silver halide emulsion.

The present invention is a modification of the basic double exposure and double thermal treatment procedure for reproducing a multi-color subject in a polychromatic glass body, the glass containing an alkali fluoride and a silver halide selected from silver chloride, silver bromide and silver iodide and being capable of integral and multiple coloration by metallic silver. In accordance with the basic process, a portion of the glass body surface is exposed to high energy or actinic radiation at a temperature below the glass transformation range, and the exposed glass is then heated at a temperature between the glass transformation range and the glass softening point to cause nucleation and growth of alkali fluoride microcrystals in conjunction with silver halide. The nucleated glass is again exposed to high energy or actinic radiation and reheated to cause nuclei growth and color development.

In accordance with the present modification, the glass is initially exposed to ultra-violet radiation through a continuous tone film negative wherein each of the colors in the original subject has been recorded in terms of a film density corresponding to such color in the developed glass, and wherein the areal definition of each density corresponding to a color, and the physical relationship of these several areas in the film, correspond to the areal definition and relationship in the original subject. Ultra-violet radiation must be used in exposing the glass since the film negative would be damaged by the alternative high energy radiation.

The continuous tone film negative, which serves as a mask or filter, may be produced by photographing the original subject through a combination of filters which correct the film response to the polychromatic glass response, that is bring the film sensitivity and glass sensitivity into correspondence at the spectral wavelengths of the colors involved. Alternatively, each color in the original subject may be recorded in corresponding areal definition on a separate negative film and a single continuous tone film of corrected density produced from the several negatives.

GENERAL DESCRIPTION

The present invention is essentially concerned with the initial exposure step of the basic four-step process for selectively producing different colors in polychromatic glass. Thus, it contemplates adopting previously disclosed practices without change, except as hereinafter described.

The color or hue produced in a polychromatic glass is primarily a function of exposure flux during the initial exposure step. Thus, while the full range of a color is governed by a combination of the two exposure steps, the hue or color is determined in the initial step and the saturation or depth is normally determined in the second exposure.

The degree of exposure flux provided in the initial exposure step is expressed as the product of time and intensity. In terms of a formula, Exposure flux = intensity × time.

The range of colors produced with increasing exposure flux are shades of pale yellow, green, blue, violet, red, orange and yellow.

Heretofore, it has been customary to vary exposure flux, and thus color, by varying exposure time. The present invention departs from prior practice by providing a method that varies exposure flux in the initial step by varying exposure intensity rather than time. Thus, based on certain observed similarities between silver halide photographic emulsions and polychromatic glass, the present approach is to produce a range of colors in polychromatic glass by using a predetermined variable intensity pattern during an initial exposure step of fixed time.

A major tool used in the comparison and evaluation of silver halide photographic emulsions is the characteristic curve. A graph of the Density (D) versus log Exposure (log E) allows the gamma ($\gamma$), contrast index (C.I.), and emulsions speed (k/E) of a film to be determined. It has been found that a similar analysis of polychromatic glasses can be made.

FIGS. 1(a) and (b) show representative characteristic curves for a silver halide photographic emulsion (1a) and for a polychromatic glass (1b). FIG. 1a is a D versus log E curve for a typical photographic film negative receiving standard development. The gamma (the slope of the straight line portion of the characteristic curve) and contrast index (the slope of the line connecting the maximum and minimum useful density values) are numerical designations for the contrast properties of a photographic material, with the latter being generally preferred. The contrast index considers the useful heel and toe regions, while the gamma does not. The exposure range is the difference between the exposure values corresponding to the maximum and minimum useful densities.

If the straight-line portion of the curve is extended backward to intersect the horizontal line at a value $D_o$, the base density, the value of the exposure $E_o$ at the point of intersection, is known as the inertia of the emulsion. The reciprocal of the inertia is proportional to the emulsion speed, given by $k/E_o$, where k is an arbitrary constant chosen by the user.

Figure 1B:
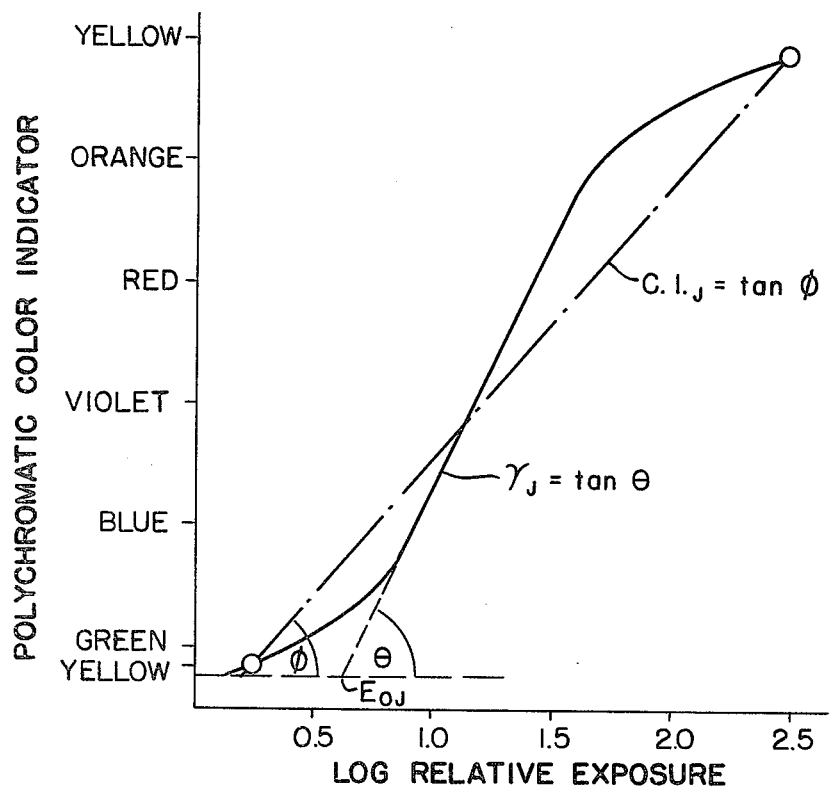
FIG. 1(b) is a corresponding graphical illustration for a polychromatic glass.

FIG. 1b is an analogous characteristic curve which allows a corresponding evaluation to be made of polychromatic glasses. The quantities designated as $\gamma_J$, $C.I._J$ and $E_{OJ}$ are obtained by plotting a polychromatic color indicator, rather than Density, versus log Relative Exposure. The best color indicators thus far determined for the purpose of generating characteristic curves are the wavelength of the peak of the polychromatic glass absorption band and/or the dominant color wavelength.

Particular values of $\gamma_J$, C.I.$_J$ and E$_{OJ}$ required to most effectively use a glass for acceptable color photographic reproductions depend on the specific reproduction technique evaluated. Thus, a standard processing technique must be employed when generating characteristic curves if comparisons are to be possible. The values obtained from these curves are strongly dependent on the development process, including both exposures and heat treatments.

The present invention adopts a processing technique based on using continuous tone photographic film, and is hereafter referred to as the continuous tone method or technique. With this technique, it is possible to fully control hue reproduction, but control of color saturation or intensity is limited. Consequently, the present process is primarily applicable as a means of reproducing art media rather than a true photocopy medium.

The continuous tone method involves using a standard photographic film negative, or the equivalent, as a filter to control the exposure intensity to the glass. In this way, ultimate colors in the image are dictated by density variations in the film negative. Unfortunately, when using a standard panchromatic negative as an ultra-violet filter, there is normally little correlation between colors in the original subject, densities in a panchromatic, black and white negative corresponding to those colors, and resultant colors produced in polychromatic glass by exposure through such density areas in the film. A direct correspondence must be established among these three parameters to render the continuous tone method feasible.

Figure 2:
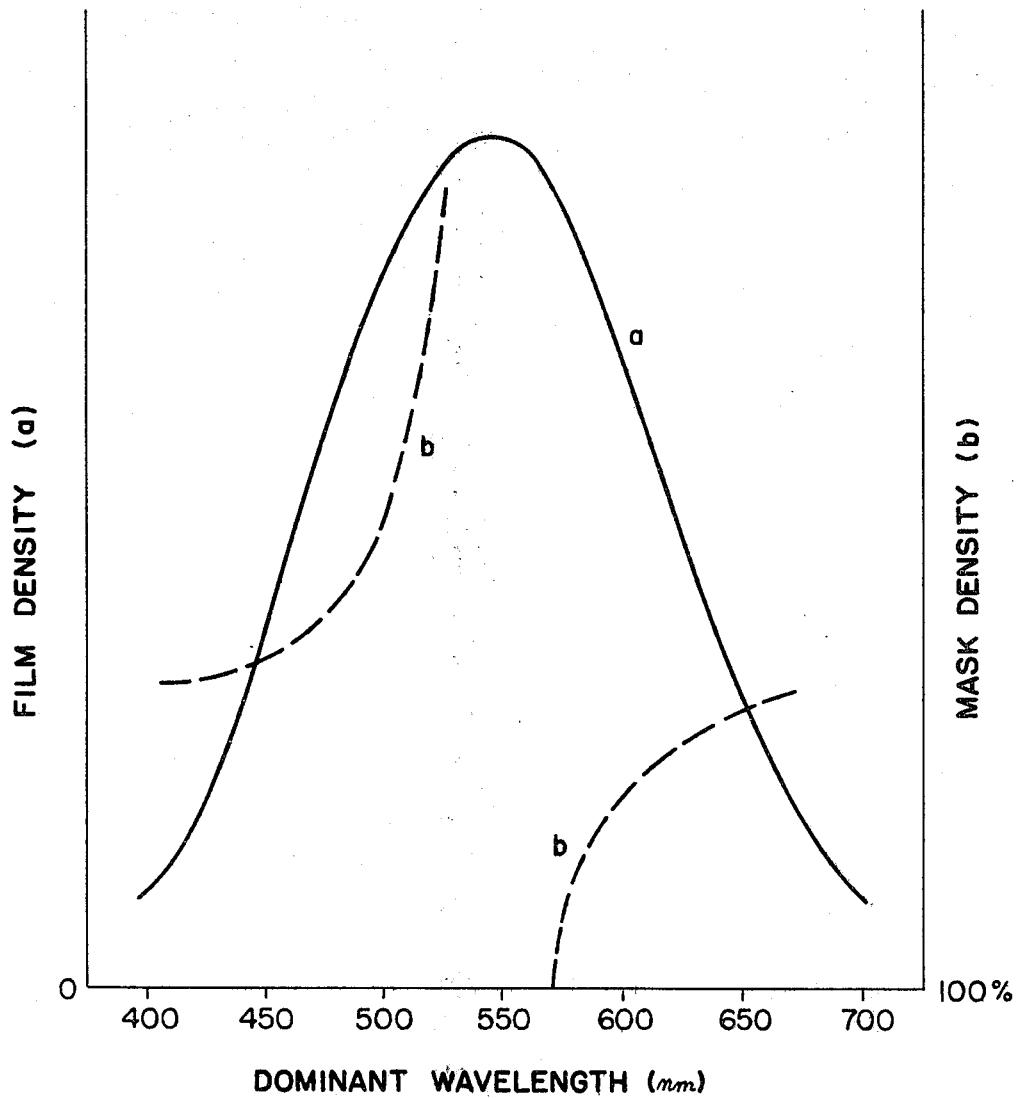
FIG. 2 is a graphical illustration comparing film density, as developed in a typical panchromatic photographic film in response to color exposure, with hues produced in a polychromatic glass.

Black and white, panchromatic film has a spectral sensitivity similar to that of the human eye, as shown by the solid-line curve of FIG. 2. This curve is generated only when maintaining constant and uniform saturation and lightness values for the photographed hues. The broken line curve of FIG. 2 shows mask density versus hues (dominant wavelength) produced in a polychromatic glass. Photographing original full-color artwork, with constant saturation and lightness values, through a set of properly selected color filters will map the solid-line curve into the broken-line curve, allowing the direct preparation of photomasks. While seemingly very simple, this technique is not without very strict limitations.

Due to the discontinuity in the yellow-green region of the mask density versus polychromatic hue curve, it is not possible to completely match the two curves of FIG. 2. However, for the purpose of reproducing designer selected images for general decoration, for which this technique is intended, the curves do not need to be fully matched. To produce an image in polychromatic glass that embodies N different colors, only those N hues must be matched. The selection of color filters is relatively easy for N=2 or 3, but becomes progressively more difficult as N increases above three. Matching of the spectral curves only provides for hue reproduction. It does not determine the saturation and lightness levels in the polychromatic glass.

In the filter correction method, just described, the subject may, in theory, be directly photographed through properly selected color filters onto continuous tone, panchromatic, ultra-violet transmitting, film to produce the desired mask for glass exposure. However, as a practical matter, the subject is usually photographed onto ordinary film which may be any size, including projection slide size, and need not be ultra-violet transmitting. This photo is then copied, with suitable enlargement or other treatment, onto an ultra-violet transmitting film, e.g. Kodak 7302, having the desired size and other characteristics for a mask.

The requirements for the original color artwork are few, but necessary. All artwork produced for polychromatic glass decoration must use the same colorants and substrates. The colorants must be reproducible and must provide a complete and uniform covering of the substrate. A transparent substrate material is preferable to allow the design's background coloring in the glass to be easily controlled. At least two methods of artwork production may be used.

A silk screened trans-adhesive has successfully been used for two-color plus background artwork. The colorants are applied smoothly, with no surface texture to provide unwanted light reflections and shadows. However, colorant mixing variations may make the accurate reproduction of a color palette impossible for a given set of filters.

An alternative is to paint the original color artwork with standard commercial paints on matte acetate. Windsor-Newton paints, which are available in a large number of colors, may be used to eliminate the need for mixing. However, when handpainting it may be difficult to produce a smooth, uniform colorant surface.

The basic concept of the continuous tone technique involves producing areas of proper density in the film mask to permit relative levels of ultraviolet radiation during a fixed exposure time that will provide the desired image and colors in polychromatic glass. As described above, this controlled variation of mask density can be accomplished directly when photographing original artwork through properly selected color filters. An alternate method allows the density variations to be made when processing the film mask.

A design which requires N different colors to be produced in polychromatic glass can be produced on N black and white originals. Each black and white original contains the image location of one of the N desired polychromatic glass colors. Photographing each of the N originals individually on black and white high contrast film, such as Kodak Kodalith film, provides N total separation masks, one for each of the desired hues. Copying the N intermediate masks onto a single continuous tone film at selected appropriate times of exposure during such copying yields a single mask with N different densities. While eliminating the need for proper filter selection, this method requires accurate registration, and uniform and adequate film development.

The N originals, after being photographed separately, must produce intermediate masks of precisely the proper size. Precise registration is imperative when making the final mask so that there is no overlap of the individual color images, a difficult task for spatially complex images.

While the use of the continuous tone photomask is relatively simple, its production is not. Each desired hue requires a unique density value for given ultra-violet exposure and heat treatment schedules. The production of a design in polychromatic glass having N different hues requires a photomask with N different densities. To produce such a photomask, N total color separations, that is N originals, are produced on high-contrast film. This film has only two densities—clear or opaque. The individual high contrast, total color separations are registered and punched as overlays. The N color separations are used as masks, individually, for contact printing on a single continuous tone film. The continuous tone film is exposed N different times, one time for each of the N total color separation masks. Using a different exposure time for each of the N total color separation masks results in N different densities being produced in the continuous tone film. The individual contact printing exposure times are selected to produce the required film optical densities which correspond to the desired hues. The continuous tone film is then used as a photomask when exposing polychromatic glass. The processed polychromatic glass then has N different hues corresponding to the N different continuous tone film densities.

The continuous tone technique of the present invention is not limited by the physical complexity of an image or piece of art work. Rather, the spatial resolution of the method is equivalent to standard photographic photocopy techniques. Thus, ultimate resolution is determined by and dependent on the subject. Hence, in preparing artwork, care must be taken to maintain the degree of resolution desired.

It is characteristic of polychromatic glass that hue development depends on the degree of exposure flux in the initial exposure step. Thus, either the time or the radiation intensity of the initial exposure may be varied to permit control of the ultimate hue developed in an exposed area. However, such variations provide essentially no control of color saturation.

Color saturation has been recognized as a function of the second exposure step. Thus, color saturation increases with increase in exposure flux of the second exposure step. However, the saturation of each hue, as well as the saturation within a given hue, is uniformly affected over the entire areal extent of the image. This negates any actual variation or control between different hues, or within a given hue area.

A further feature of the present invention is that it provides a means of exercising a degree of control over color saturation, and hence achieving some variation within an image. In general, this is accomplished by further modifying the continuous tone film mask described above to selectively and differentially block exposure through different areas of the mask. The saturation of the hue ultimately developed in each area is correspondingly reduced, thus providing a means of diminishing, and thereby controlling, saturation.

In accordance with one specific procedure, a second set of total color separations is prepared by halftone screening to reflect variations in individual hues. For example, in copying a subject embodying N different colors, a set of N total color separations is prepared as before on high contrast film by photographing the subject through suitable filters. These color separations are then exposed through a halftone screen to produce a set of screened positives, each positive having dot sizes selected in size according to the degree of saturation desired.

Each screened positive may be combined with a corresponding member of the initial hue-determining set. The several combinations are then copied onto the continuous tone film to be used as a mask. The density of the film in each area will be determined by exposure time as described earlier. Simultaneously, however, the dotted positive, that is the positive prepared by halftone screening, is copied as a pattern of dots in the defined hue area. These copied dots are essentially opaque to the radiation employed for glass exposure. The presence of opaque dots in the ultimate exposure mask produces essentially clear dots in the image ultimately developed in the glass. This in turn reduces the color concentration or saturation in each hue area depending on the dot size in that area. Thus, the larger the dots, the less color saturation. In other words, the area of a particular hue having the highest spatial density dots is the hue area with the least saturation.

This procedure may be modified by using a set of completely halftone screened films of varying size dots. For each exposure of the ultimate continuous tone film mask, a screened film of desired size is used with the hue determining negative employed. Thus, if a red hue of quite low saturation is desired, a screened film having relatively large dots will be employed with the color separation negative corresponding to the red area. The relatively large opaque dots thus produced in the red area of the ultimate image in glass will then reduce substantially saturation of the red color.

The foregoing techniques permit providing different saturation levels for different hues. They permit only reducing or diminishing a predetermined saturation level. Accordingly, it will normally be desirable to program the color development process for a relatively high saturation level and reduce each hue as desired. Also, it will be appreciated that, while the technique is described in terms of a dot pattern, other geometric patterns, e.g. a linear pattern, may be employed as well.

Once a latent image is produced in a polychromatic glass by masked exposure of the glass as just described, subsequent processing may follow any of the known practices described earlier to the background. Thus, the glass may be heat treated at a temperature at or above the glass transformation range, but not above its softening point. Thereafter, the glass is again exposed to ultraviolet radiation which may, for example, be the same ultraviolet lamp as used in the initial exposure. Finally, the glass is again heated to a temperature between the transformation and the softening point to develop the multi-color image.

The second exposure step may simply be a flooding of the glass with the selected radiation. However, this may result in an objectionable yellow case developing in portions of the glass outside the image area. In order to maintain the peripheral glass unexposed, and hence uncolored, an additional screened transparency mask may be used. This mask is a composite of the several color separation masks produced for the initial exposure step. It is transparent only in the areas that received any first exposure, thereby masking all of the glass surface outside the image periphery.

In some instances, the image development and film coverage will be confined to less than the total glass surface. In that case, the remaining area may be completely shielded throughout the processing. For flat glass articles, this may be accomplished by applying, to the areas to be masked, a high temperature paint that is opaque to the radiation being employed.

Silk screening may be used to apply a masking paint on flat surfaces, but this does not give high resolution on a curved surface such as a dinner plate. High temperature masking materials may be applied to curved surfaces by means of a pliable material capable of transferring the masking solution to a curved surface.

Presently available polychromatic glasses are not capable of having a black color developed. However, in some cases, a very dark violet or blue may provide an acceptable means of contrast. White is also not available as a polychromatic color. Hence, if required, it must be supplied by providing a suitable background. Thus, the glass may be provided with a white backing. Also, polychromatic glass compositions, capable of having opal coloration developed therein, may be employed. At least some polychromatic glasses can have opacifying particles grown by extending the heat treating steps. Also, as described in greater detail in U.S. Pat. No. 4,134,747, polychromatic glasses melted in a reducing atmosphere may undergo reverse opal formation, that is opal formation will occur in unexposed glass areas while exposed areas remain unopacified.

A technique for producing a gray scale, that is any desired shade or shades of gray, involves using a photo-opal glass. A photo-opal glass is one which produces an opalescent crystallization when exposed to ultra-violet radiation and subsequently heat treated. The depth of opalization is dependent on the amount of exposure, with maximum opalization corresponding to the most ultra-violet exposure. The variation of depth results in appearances ranging from nearly opaque, to translucent, to clear, corresponding to high, midrange and zero exposure. Affixing a black backing to the glass in the colorless areas of an image combined with varying degrees of white opacity provides a gray scale which ranges from black, for areas having no opalization, to white, for areas having complete opacification.

A continuous tone film mask can be used to control the glass exposure, thereby controlling the amount and location of opacification. The film would be relatively opaque in areas which are to be colored and would have degrees of density corresponding to the amount of opal depth required in the desired areas to provide the necessary degree of gray. The gray areas must be masked during the second ultra-violet exposure to maintain a white opal.

A variation of the technique just described enables varying the brightness of colors as well as producing a gray scale for colorless areas of an image if desired. This technique involves producing a laminated glass article, that is a piece of transparent polychromatic glass laminated to a piece of white photo-opal glass. The photo-opal glass must be provided with a black backing, as by adhering a black layer or coating to the back. A multicolor image will be developed in the polychromatic glass in accordance with the present invention as described earlier. The photo-opal will be developed separately and will contain an opal image corresponding in areal definition to the outer extremities of the total image in the polychromatic glass. The two glasses must be maintained in registration while they are being joined.

A continuous tone mask of variable density may be used in exposing the photo-opal glass for opal development. Thus, the area of greatest density in the film permits the least glass exposure, and results in the least or shallowest opal development. Conversely, areas of decreasing density in the film transmit increasing amounts of radiation to the glass, and hence increase the depth of opal development.

It will be appreciated that a given hue and saturation in a polychromatic glass can thereby have its brightness controlled by the amount of opalization behind it. At the same time, colorless areas can have desired shades of gray developed. Such shades vary from white, when the laminated opal has maximum opal development due to prolonged exposure, to black, when the opel glass has essentially no opal development due to little or no radiation exposure.

SPECIFIC EMBODIMENT

A polychromatic glass was melted having the following approximate composition in parts by weight:

$SiO_2$—69.7
$Al_2O_3$—6.8
$Na_2O$—15.7
$ZnO$—4.8
$F$—2.3
$Br$—0.9
$Ag$—0.01
$Sb_2O_3$—0.2
$CeO_2$—0.04
$SnO$—0.05

The glass was delivered from the melting tank to preheated pressing molds at a temperature of about 1325° C. Eleven inch dinner plates weighing about 750 grams each and six inch saucers weighing about 225 grams each were pressed and annealed.

This ware was initially exposed for 4 ½ minutes to radiation from an ultraviolet lamp. The glass was exposed through a continuous tone negative film having formed therein a variable density image corresponding to the image desired in the glass, namely a zinnia floral pattern. Preparation of the variable density film is described in detail subsequently.

The ware was initially exposed to ultra-violet radiation transmitted through a mirror and lens optical system which essentially collimated the radiation and directed it onto the glass supported in a horizontal position. The optical system was one available from Optical Radiation Corporation, Azusa, California and identified as ORCON II—Model 390. The system was provided with a high pressure, Hg-Xe vapor lamp delivering 2500 watts total power and identified as HVF 2500-5. This lamp was mounted in a parabolic reflector.

Intensity of radiation reaching the glass surface was calculated, based on an estimate of losses in transmission, and is throught to be about one watt per square inch, equivalent to 0.15 watts per square centimeter. Inasmuch as this is an integration over lambda, the effective radiation, that is radiation in the polychromatic glass area of sensitivity (app. 280–320 nm. range), is about a tenth of the total, or about 0.1 watts per square inch.

The exposed ware was then heat treated in an electrically heated kiln for about one hour at 520° C. after which it was cooled at a sufficiently slow rate to avoid breakage.

Thereafter the ware was subjected to a combined ultra-violet exposure and heat treatment. This was carried out in a kiln operating at about 350° C. with exposure time being ten minutes. The top of the kiln was provided with a sheet of Code 7915 glass, an ultra-violet transmitting, 96% silica glass available from Corning Glass Works, Corning, New York.

When the ware was cooled, a zinnia floral decoration was observed in the glass that corresponded to predetermined design and hues.

In producing the variable density film negative, or mask, for use as described above, Kodak 7302 fine grain film was used. This is a conventional, acetate base, photographic film which, after exposure, was processed using commercially available materials in accordance with this schedule:

Developer—Two minutes at 68° F. in Kodak Dektol developer mixed with two parts water to one part developer.

Stop Bath—30 seconds in Kodak Indicator stop bath at 68° F.

Fix—Three minutes at 68° F. in Kodak Kodafix mixed one part fix to three parts water Wash—Two minutes in Kodak Hypo-Eliminator, plus five minutes in continuous flow water bath, both at 68° F.

Clear film has a 300 nm. transmittance which progressively decreases from about 60% to less than 1% as the film is fully exposed and developed. Visible light optical densities, as measured on a McBeth TD-504 densitometer, were found to be equally valid, and much easier to measure, for monitoring purposes.

Figure 3:
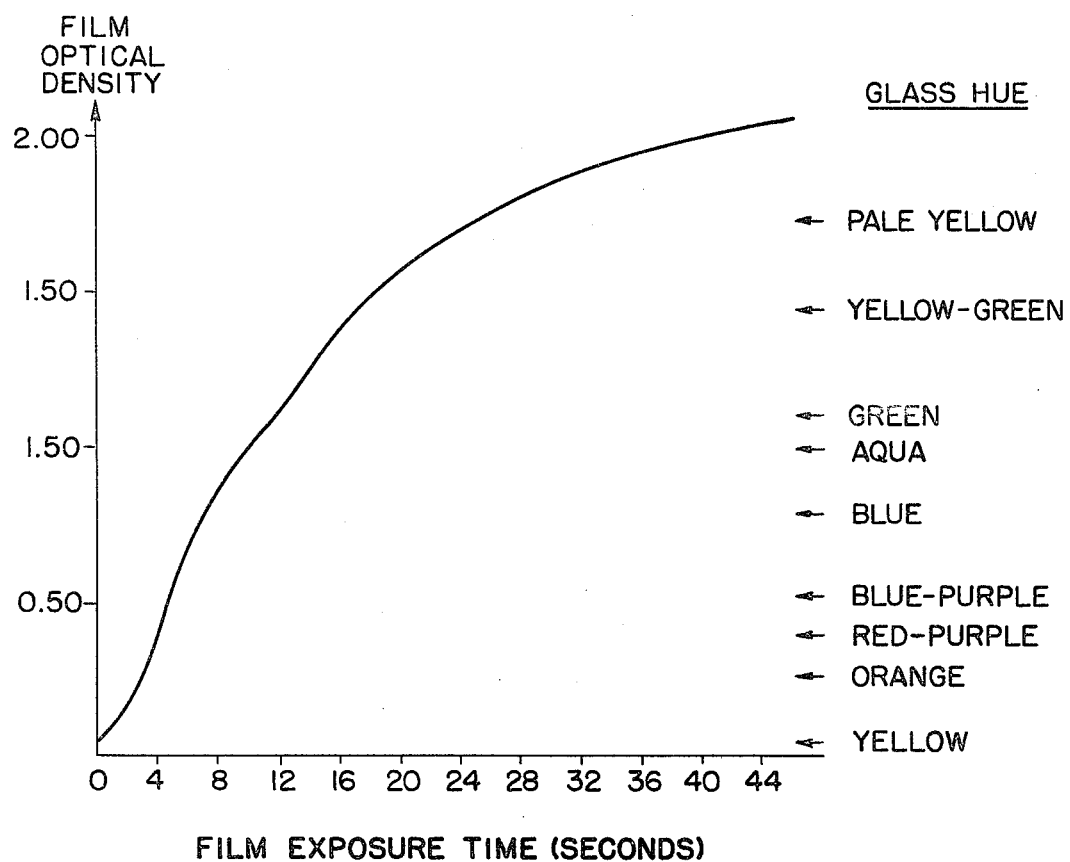
FIG. 3 is a graphical illustration comparing hues in a polychromatic glass with optical density in a film negative and with exposure time.

FIG. 3 shows the relationship of polychromatic glass hue (right hand vertical axis) to ultra-violet exposure time (horizontal axis), as well as its correspondence to film optical density (left hand vertical axis).

The floral pattern being developed was defined in terms of six separate hues, the area of each being precisely determined in the original artwork. A separate negative was then prepared for each hue using a set of six high contrast films to produce a set of six total color separation negatives. After exposure, each high contrast film is clear in an area corresponding to the area of the hue being recorded and otherwise opaque.

Each of the six color records on Kodalith MP (machine processable), high contrast film was individually contact printed on a single continuous tone film by using punched films and mounting in precise registry for exposure of the continuous tone film through each high contrast negative. The individual contact printing exposure times were selected, on the basis of relationships as shown in FIG. 3, to produce the film optical densities required to produce the six original hues in the photochromic glass. Thus, with the lamp set to deliver about two foot candles illumination, the exposure time for each mask, the optical density produced, and the ultimate glass hue, were:

| Mask # | Exposure Time (seconds) | Optical Density | Hue |
|---|---|---|---|
| 1 | 3 | 0.26 | Orange |
| 2 | 12 | 1.10 | Green |
| 3 | 16 | 1.45 | Yellow-Green |
| 4 | 4.5 | 0.52 | Blue-Purple |
| 5 | 3.75 | 0.39 | Red-Purple |
| 6 | 10 | 1.00 | Aqua |

The continuous tone negative, produced by consolidating in it the six individual density areas corresponding to the six desired colors, was then conformed to fit tightly against a plate. This was done by use of heat and vacuum to precisely sag the exposure mask to fit the contour of the plate prior to exposure.

I claim:

1. A method of producing an image of a subject embodying at least two distinct colors in a polychromatic glass containing an alkali fluoride and a silver halide selected from silver chloride, silver bromide and silver iodide, and being capable of integral and multiple coloration by metallic silver, wherein the glass is exposed to ultra-violet radiation at a temperature below the glass transformation range, the exposed glass is then heated to a temperature between the transformation range and the softening point of the glass to cause nucleation and growth of microcrystals of alkali fluoride in conjunction with silver halide, the glass is re-exposed to ultra-violet radiation and further heated to cause nuclei growth to impart color, the method being characterized by initially exposing the glass to ultraviolet radiation through a single, continuous tone, ultraviolet transmitting, film negative in which each of the colors in the original subject has been recorded in terms of a film density corresponding to that color in the developed glass, and wherein the areal definition of each density area corresponding to a color, and the physical relationship of these several areas in the film, correspond to the areal definition and relationship in the original subject, and the method being further characterized in that a continuous tone film negative is produced by exposure of the film to the original subject through the medium of filters which bring the film response and the polychromatic glass response into correspondence at least at the spectral points of interest.

2. The method of claim 1 wherein the image being produced is defined in terms of N colors corresponding generally to N points or zones in the visible spectrum, photographic filters are selected that alter the film sensitivities at these N points or zones to correspond with those of the glass at the same points or zones, and the film is exposed to the subject through the filters to produce corrected density areas therein corresponding to glass hues, and the polychromatic glass is exposed to ultra-violet radiation through the mask for a predetermined time to develop a latent image therein corresponding in latent hues to the original subject.

3. The method of claim 1 wherein the subject is directly photographed on a continuous tone film through the medium of filters, and this photo is then copied onto ultra-violet transmitting, continuous tone film to produce an exposure mask for exposing the polychromatic glass for a fixed time.

4. A method of producing an image of a subject embodying at least two distinct colors in a polychromatic glass containing an alkali fluoride and a silver halide selected from silver chloride, silver bromide and silver iodide, and being capable of integral and multiple coloration by metallic silver, wherein the glass is exposed to ultraviolet radiation at a temperature below the glass transformation range, the exposed glass is then heated to a temperature between the transformation range and the softening point of the glass to cause nucleation and growth of microcrystals of alkali fluoride in conjunction with silver halide, the glass is re-exposed to ultra-violet radiation and further heated to cause nuclei growth to impart color, the method being characterized by initially exposing the glass to ultra-violet radiation through a single, continuous tone, ultra-violet transmitting, film negative in which each of the colors in the original subject has been recorded in terms of a film density corresponding to that color in the developed glass, and wherein the areal definition of each density area corresponding to a color, and the physical relationship of these several areas in the film, correspond to the areal definition and relationship in the original subject, and the method being further characterized in that the subject being reproduced is defined in terms of N colors, the areal location of each of the N colors in the subject is photographically recorded on an individual, black and white, high contrast film to produce N total color separation negatives, the N total color separation negatives are copied onto a single, continuous tone film, with film density being corrected from subject color correspondence to polychromatic glass color correspondence, to produce a single film, controlled density mask, and exposing the polychromatic glass to ultraviolet radiation through the mask for a predetermined time to develop a latent image therein corresponding in latent hues to the original subject.

5. The method of claim 4 wherein exposure time through each individual color film is controlled to impart to the continuous tone film a film density to correspond with the color sensitivity in the polychromatic glass.

6. The method of claim 4 wherein the several individual films are placed in registry and a master copy made photographically.

7. A method of producing an image of a subject embodying at least two distinct colors in a polychromatic glass containing an alkali fluoride and a silver halide selected from silver chloride, silver bromide and silver iodide, and being capable of integral and multiple coloration by metallic silver, wherein the glass is exposed to ultraviolet radiation at a temperature below the glass transformation range, the exposed glass is then heated to a temperature between the transformation range and the softening point of the glass to cause nucleation and growth of microcrystals of alkali fluoride in conjunction with silver halide, the glass is re-exposed to ultraviolet radiation and further heated to cause nuclei growth to impart color, the method being characterized by initially exposing the glass to ultra-violet radiation through a single, continuous tone, ultra-violet transmitting, film negative in which each of the colors in the original subject has been recorded in terms of a film density corresponding to that color in the developed glass, and wherein the areal definition of each density area corresponding to a color, and the physical relationship of these several areas in the film, correspond to the areal definition and relationship in the original subject, and the method being further characterized in that transmission through at least one density area on the continuous tone is reduced to correspondingly reduce the saturation of the color developed in a polychromatic glass by exposure through such density area in the film.

8. A method in accordance with claim 7 wherein transmission is reduced by further recording a halftone dot pattern on the density area in the film.

9. A method of producing an image of a subject embodying at least two distinct colors in a polychromatic glass containing an alkali fluoride and a silver halide selected from silver chloride, silver bromide and silver iodide, and being capable of integral and multiple coloration by metallic silver, wherein the glass is exposed to ultra-violet radiation at a temperature below the glass transformation range, the exposed glass is then heated to a temperature between the transformation range and the softening point of the glass to cause nucleation and growth of microcrystals of alkali fluoride in conjunction with silver halide, the glass is re-exposed to ultraviolet radiation and further heated to cause nuclei growth to impart color, the method being characterized by initially exposing the glass to ultra-violet radiation through a single, continuous tone, ultra-violet transmitting, film negative in which each of the colors in the original subject has been recorded in terms of a film density corresponding to that color in the developed glass, and wherein the areal definition of each density area corresponding to a color, and the physical relationship of these several areas in the film, correspond to the areal definition and relationship in the original subject, and the method being further characterized in that transmission through density areas in the continuous tone film is selectively and differentially blocked to alter the saturation of hues developed in polychromatic glass by exposure through such density areas.

10. A method in accordance with claim 9 wherein the transmission blocking means is a halftone dot pattern, the size of the dots varying in different density areas.

11. A method in accordance with claim 9 wherein a set of total color separations is prepared on high contrast film, each color separation is copied through a halftone screen to produce a halftone positive, the time of copying each separation being determined by the size dots desired to reduce color saturation a desired degree, and each halftone positive being combined with a corresponding, hue-determining color separation, and each combination then being copied onto a continuous tone film to produce a modified, continuous tone film negative.

12. A method of producing an image of a subject embodying at least two distinct colors in a polychromatic glass containing an alkali fluoride and a silver halide selected from silver chloride, silver bromide and silver iodide, and being capable of integral and multiple coloration by metallic silver, wherein the glass is exposed to ultra-violet radiation at a temperature below the glass transformation range, the exposed glass is then heated to a temperature between the transformation range and the softening point of the glass to cause nucleation and growth of microcrystals of alkali fluoride in conjunction with silver halide, the glass is re-exposed to ultra-violet radiation and further heated to cause nuclei growth to impart color, the method being characterized by initially exposing the glass to ultra-violet radiation through a single, continuous tone, ultra-violet transmitting, film negative in which each of the colors in the original subject has been recorded in terms of a film density corresponding to that color in the developed glass, and wherein the areal definition of each density area corresponding to a color, and the physical relationship of these several areas in the film, correspond to the areal definition and relationship in the original subject, and the method being further characterized in that a polychromatic glass is selected that is capable of being photosensitively opalized, the glass is exposed to radiation through a continuous tone film mask wherein color areas in the subject are recorded in terms of maximum density whereby essentially no transmission occurs during glass irradiation, gray areas are recorded in film densities inversely related to the depth of gray desired, the glass is exposed to radiation through such film mask and heated to develop opacity in exposed areas, the depth of opacity decreasing with increase in film density, and the glass is then provided with a black backing.

13. A method of producing an image of a subject embodying at least two distinct colors in a polychromatic glass containing an alkali fluoride and a silver halide selected from silver chloride, silver bromide and silver iodide, and being capable of integral and multiple coloration by metallic silver, wherein the glass is exposed to ultra-violet radiation at a temperature below the glass transformation range, the exposed glass is then heated to a temperature between the transformation range and the softening point of the glass to cause nucleation and growth of microcrystals of alkali fluoride in conjunction with silver halide, the glass is re-exposed to ultra-violet radiation and further heated to cause nuclei growth to impart color, the method being characterized by initially exposing the glass to ultra-violet radiation through a single, continuous tone, ultra-violet transmitting, film negative in which each of the colors in the original subject has been recorded in terms of a film density corresponding to that color in the developed glass, and wherein the areal definition of each density area corresponding to a color, and the physical relationship of these several areas in the film, correspond to the areal definition and relationship in the original subject, and the method being further characterized in that the polychromatic glass having a multicolor image developed therein is laminated to a backing of photosensitive opal glass having developed therein an opal image corresponding in areal definition to the outer extremities of the total image in the polychromatic glass, the opal density being greatest behind those color areas where the least reduction in brightness is desired and the opal glass has a black backing.

14. A method in accordance with claim 13 wherein an area outside the image area in the photosensitive opal is opacified in depth in inverse relation to the darkness of gray color desired in that area.

15. A method of producing a mask for use in exposing polychromatic glass to develop an image of a multicolor subject therein, the method comprising recording each of the colors of the subject in a continuous tone film negative in terms of a unique, film density correlated to such color in the glass, the areal definition of each density in the film corresponding to the areal definition of the correlated color in the subject, and the several film densities being such that a latent image of the subject is reproduced in the glass by a single time exposure through the mask, and the method being further characterized in that each color is recorded in the continuous tone film by photographing the subject through a filter selected to bring that color in the subject into correspondence with that color in polychromatic glass.

16. A method of producing a mask for use in exposing polychromatic glass to develop an image of a multicolor subject therein, the method comprising recording each of the colors of the subject in a continuous tone film negative in terms of a unique, film density correlated to such color in the glass, the areal definition of each density in the film corresponding to the areal definition of the correlated color in the subject, and the several film densities being such that a latent image of the subject is reproduced in the glass by a single time exposure through the mask, and the method being further characterized in that the subject is recorded on a set of N high contrast, total color separation negatives, each negative corresponding to a color in the subject, and each negative is contact printed on a single piece of continuous tone film, the contact printing exposure time for each negative being determined by the position of its color on a density versus polychromatic hue scale.

17. A method of producing a mask for use in exposing polychromatic glass to develop an image of a multicolor subject therein, the method comprising recording each of the colors of the subject in a continuous tone film negative in terms of a unique, film density correlated to such color in the glass, the areal definition of each density in the film corresponding to the areal definition of the correlated color in the subject, and the several film densities being such that a latent image of the subject is reproduced in the glass by a single time exposure through the mask, and the method being further characterized in that transmission through at least one density area on the continuous tone film is reduced to correspondingly reduce the saturation of the color developed in a polychromatic glass by exposure through such density area on the film.

18. A method in accordance with claim 17 wherein transmission is reduced by further recording a halftone dot pattern on the density area in the film.

19. A method of producing a mask for use in exposing polychromatic glass to develop an image of a multicolor subject therein, the method comprising recording each of the colors of the subject in a continuous tone film negative in terms of a unique, film density correlated to such color in the glass, the areal definition of each density in the film corresponding to the areal definition of the correlated color in the subject, and the several film densities being such that a latent image of the subject is reproduced in the glass by a single time exposure through the mask, and the method being further characterized in that transmission through density areas on the continuous tone film is selectively and differentially blocked to alter the saturation of hues developed in polychromatic glass by exposure through such density areas.

20. A method in accordance with claim 19 wherein the transmission blocking means is a halftone dot pattern, the size of the dots varying in different density areas.

21. A method in accordance with claim 19 wherein a set of total color separations is prepared on high contrast film, each color separation is copied through a halftone positive, the time of copying being determined by the size dots desired to reduce color saturation a desired degree, and each halftone positive being combined with a corresponding hue determining color separation, and each combination then copied onto a continuous tone film.

* * * * *